United States Patent [19]

Tsutsui

[11] Patent Number: 5,850,291
[45] Date of Patent: Dec. 15, 1998

[54] PROJECTION EXPOSURE APPARATUS AND METHOD FOR CONTROLLING A STAGE ON THE BASIS OF A VALUE CORRECTED BY ABBE ERROR

[75] Inventor: Shinji Tsutsui, Utsunomiya, Japan

[73] Assignee: Canon Kabushiki Kaisha, Tokyo, Japan

[21] Appl. No.: 823,679

[22] Filed: Mar. 25, 1997

[30] Foreign Application Priority Data

Mar. 26, 1996 [JP] Japan ................................. 8-094694

[51] Int. Cl.⁶ .............................. G01B 11/00; G01B 9/02
[52] U.S. Cl. ......................... 356/400; 356/363; 356/401
[58] Field of Search .................................. 356/345, 363, 356/400, 399, 401

[56] References Cited

U.S. PATENT DOCUMENTS

5,150,152  9/1992  Isohata et al. .
5,638,179  6/1997  Masuyuki ................................. 356/376

*Primary Examiner*—Robert Kim
*Attorney, Agent, or Firm*—Fitzpatrick, Cella, Harper & Scinto

[57] ABSTRACT

An exposure method and apparatus for transferring a pattern of a mask onto a substrate to be exposed, with projection through a projection optical system. The apparatus includes a stage being movable while carrying the substrate thereon, a laser interferometer for measuring a position of the stage, wherein a measurement position of a laser beam of the laser interferometer deviates relative to a focal plane of the projection optical system, with respect to a direction of an optical axis of the projection optical system, a memory for memorizing, with respect to each of different positions of the stage, information related to an Abbe error produced in accordance with the deviation of the focal plane and the measurement position of the laser interferometer, and a controller for controlling the stage on the basis of a corrected value corresponding to a measured value of the laser interferometer as corrected by the Abbe error.

10 Claims, 4 Drawing Sheets

PROJECTION EXPOSURE APPARATUS AND METHOD FOR CONTROLLING A STAGE ON THE BASIS OF A VALUE CORRECTED BY ABBE ERROR

FIELD OF THE INVENTION AND RELATED ART

This invention relates to an exposure apparatus and an exposure method necessary for use in the manufacture of devices such as semiconductor devices or liquid crystal panels, for example, on the basis of a lithographic process.

Figure 6A:
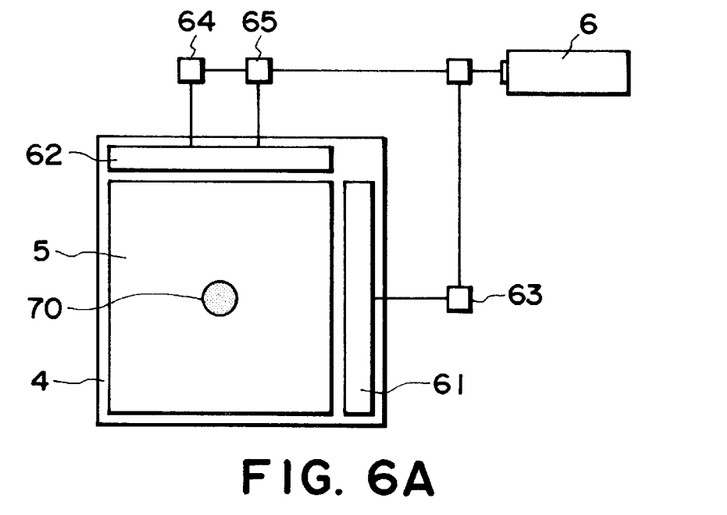
FIGS. 6A and 6B are schematic views, respectively, of a structure of an ordinary exposure apparatus.
Figure 6B:
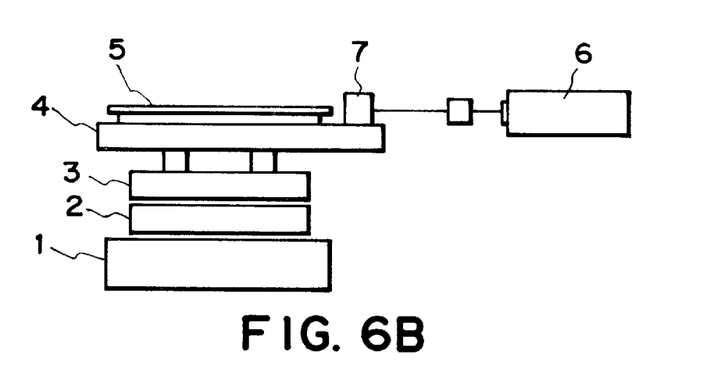

FIGS. 6A and 6B show the structure of an ordinary substrate stage having a laser interferometric measuring device for position control, wherein FIG. 6A is a plan view and FIG. 6B is a side view. Mounted on a stage base 1 is an X-Y stage (including a Y stage 2 and an X stage 3) which is movable along two orthogonal axes in X and Y directions, respectively. Mounted on the X-Y stage is a θ-Z stage 4 which comprises a θ stage rotationally movable along a horizontal plane and a Z-tilt stage being vertically movable and being adapted for movement of the type of rolling and pitching with respect to the X and Y directions. A mask or workpiece to be exposed (hereinafter, simply a "substrate") 5 is placed on the top of the substrate stage of the structure described above. Denoted at 6 is a laser head, and denoted at 61 and 62 are reflection mirrors which are fixedly mounted on the substrate stage for the laser measurement. Denoted at 63, 64 and 65 are interference mirrors, and denoted at 70 is a projection region.

In the structure of FIGS. 6A and 6B, usually, the laser beam of the laser interferometric measuring device for measurement and control of the position of the substrate 5 is positioned on the focal plane of the substrate with respect to the vertical direction (Z direction). On the other hand, within the horizontal plane, it is placed at a position approximately coincident with the optical axis of the projection optical system. This is because: if the laser beam is placed at a location deviated from the focal plane by a distance L, θ drive or rotational drive such as rolling or pitching or a change in attitude with respect to pitch, yaw or roll during stage movement may cause a deviation Ltanα of the coordinates of the substrate with respect to the optical axis (where α is the angle of rotation). It deteriorates the substrate positioning precision. Such a deviation is called an "Abbe error".

In the field of semiconductors or liquid crystals, the size of a substrate is increasing more and more. Particularly, this is notable in the field of the manufacture of liquid crystal panels. The size of a glass plate to be processed has been increased in the last few years by three times or more in area ratio. If the size of the substrate becomes larger, the substrate stage of an exposure apparatus has to be larger. On that occasion, there are two problems in connection with the position control for the substrate stage based on a laser interferometric measuring system, such as follows:

The first problem is that: in an exposure apparatus for processing a large size glass substrate, in order that the position of a laser beam with respect to the vertical direction (Z direction) is approximately placed on the focal plane of a projection optical system, a laser beam reflection mirror to be mounted on the substrate stage has to be disposed outside the glass substrate. Therefore, a structural member for fixing the mirror should be larger than the size of the substrate, and the weight of the stage has to be very large. Generally, in a substrate stage of an exposure apparatus, it is an important stage performance that, relative to high-speed motion and quick stopping, vibration during stoppage is well suppressed. To this end, the weight of the moving component should be decreased as much as possible and the natural frequency of the moving component should be increased as much as possible. However, placing the laser beam reflection mirror outside the substrate produces a result contradictory to the above.

The second problem is that: an increase in the size of the substrate causes an enlargement in the movement stroke of the substrate stage. As the substrate becomes larger, the guiding surface of the stage becomes longer and wider. It is, therefore, very difficult to assure a processing precision necessary for maintaining an attitude precision (pitching, yawing and rolling precision) during stage movement.

In summary, in an attempt to determine an optimum substrate stage structure in the tendency of the enlargement of the size of the substrate, if the laser beam position is shifted from the focal plane with respect to the vertical direction, for reducing the stage weight, the occurrence of an unexpected variation of pitching or rolling, if any, which may be attributable to the machining precision of the stage guiding surface may cause an Abbe error, resulting in a deteriorated stage positioning precision.

A laser interferometric measuring system capable of performing measurement of pitching and rolling, as well as X, Y and θ motions, may be provided so that the Abbe error may be corrected automatically. However, on that occasion, the number of axes of measurement per a single stage is five, and the quantity of data to be processed becomes very large. The processing system has to be complicated. The number of interferometers becomes large, and a wide space is necessary for placing them. If a mask stage and a workpiece stage have to be controlled at once, the number of axes is too many and the light quantity is short. This necessitates the use of two laser heads, causing the system to become too expensive.

SUMMARY OF THE INVENTION

In consideration of the inconveniences described above, it is an object of the present invention to provide an exposure apparatus and/or an exposure method by which a stage positioning precision can be held easily and with a low cost, regardless of enlargement of the size of a substrate and enlargement of the size of a substrate stage, without degrading the stage control characteristic and without complicating the laser interferometric measuring system.

In accordance with an aspect of the present invention, there is provided an exposure apparatus for transferring a pattern of a mask onto a substrate to be exposed, with projection through a projection optical system, said apparatus comprising: a stage being movable while carrying the substrate thereon; a laser interferometric measuring device for measuring a position of said stage; storing means for memorizing, in relation to each of different positions of said stage, an Abbe error produced in accordance with a deviation of an exposure position of said projection optical system and a measurement point of said laser interferometric measuring device; and control means for controlling said stage on the basis of a corrected value corresponding to a measured value of said laser interferometric measuring device as corrected by the Abbe error.

The apparatus may further comprise an optical system for detecting a position of a mark of the substrate placed on said stage, wherein said control means determines the Abbe error by moving said stage through a predetermined amount on the basis of a measured value of said laser interferometric measuring device and then by detecting the position of the mark through said optical system.

In accordance with another aspect of the present invention, there is provided an exposure apparatus for transferring a pattern of a mask onto a substrate to be exposed, with projection through a projection optical system, said apparatus comprising: a substrate stage being movable while carrying the substrate thereon; a mask stage being movable while carrying the substrate thereon; a laser interferometric measuring device for measuring a position of said substrate stage and a position of said mask stage; storing means for memorizing, in relation to each of different positions of said substrate stage and of said mask stage, an Abbe error produced in accordance with a deviation of an exposure position of said projection optical system and a measurement point for said substrate stage, of said laser interferometric measuring device; and control means for controlling one of said substrate stage and said mask stage on the basis of a corrected value, corresponding to a measured value of said laser interferometric measuring device as corrected by the Abbe error, and for relatively scanning said substrate stage and said mask stage relative to each other.

The apparatus may further comprise an optical system for detecting a relative position of a mark of a substrate placed on said mask stage and a mark of a substrate placed on said substrate stage, wherein said control means determines the Abbe error by relatively moving said substrate stage and said mask stage through a predetermined amount on the basis of a measured value of said laser interferometric measuring device and then by detecting the positional deviation through said optical system.

In the apparatus, a position of a laser beam of said laser interferometric measuring device may be deviated relative to a focal plane of said projection optical system with respect to a direction of an optical axis of said projection optical system.

In accordance with a further aspect of the present invention, there is provided an exposure method for transferring a pattern of a mask onto a substrate to be exposed, with projection through a projection optical system, said method comprising the steps of: moving the substrate through the stage; measuring a position of the stage through a laser interferometric measuring device; memorizing, in relation to each of different positions of the stage, an Abbe error produced in accordance with a deviation of an exposure position of the projection optical system and a measurement point of the laser interferometric measuring device; and controlling the stage on the basis of a corrected value corresponding to a measured value of the laser interferometric measuring device as corrected by the Abbe error.

In the controlling step, the Abbe error may be determined by moving the stage through a predetermined amount on the basis of a measured value of the laser interferometric measuring device and then by detecting the position of a mark of the stage.

In accordance with a still further aspect of the present invention, there is provided an exposure method for transferring a pattern of a mask onto a substrate to be exposed, with projection through a projection optical system, said method comprising the steps of: moving the substrate through a substrate stage; moving the mask through a mask stage; measuring a position of the substrate stage and a position of the mask stage through a laser interferometric measuring device; memorizing, in relation to each of different positions of the substrate stage and of the mask stage, an Abbe error produced in accordance with a deviation of an exposure position of the projection optical system and a measurement point for the substrate stage, of the laser interferometric measuring device; and controlling one of the substrate stage and the mask stage on the basis of a corrected value, corresponding to a measured value of the laser interferometric measuring device as corrected by the Abbe error, and for relatively scanning the substrate stage and the mask stage relative to each other.

The method may further comprise relatively moving the substrate stage and the mask stage through a predetermined amount on the basis of a measured value of the laser interferometric measuring device, and detecting a relative positional deviation between a mark of the substrate placed on the mask stage and a mark of the substrate placed on the substrate stage, to determine the Abbe error.

A position of a laser beam of the laser interferometric measuring device may be deviated relative to a focal plane of the projection optical system with respect to a direction of an optical axis of the projection optical system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

An exposure apparatus according to an embodiment of the present invention comprises a mask stage for supporting a mask having a pattern to be transferred, a substrate stage for supporting a substrate to be exposed, a projection optical system for projecting an image of the pattern of the mask onto the substrate, means for relatively scanning the mask stage and the substrate stage relative to the projection optical system, measurement and control means including a laser interferometric measuring device for measuring a position of the mask stage and a position of the substrate stage, and for controlling the position of the mask stage and the substrate stage on the basis of a measured value of the laser interferometric measuring device, and a memory for memorizing an Abbe error produced in accordance with a deviation of an exposure position of the projection optical system and a measurement point of the laser interferometric measuring device, successively measured along a scan direction beforehand, wherein the measurement and control means performs position control of the mask stage and/or the substrate stage while correcting the position as measured by the laser interferometric measuring means on the basis of an Abbe error memorized in the memory.

In this exposure apparatus, the position of a laser beam of the laser interferometric measuring device may be deviated relative to a focal plane of the projection optical system, in a direction of an optical axis of the projection optical system. Namely, a reflection mirror may be disposed below the substrate to be exposed, for example, by which it is possible to avoid enlargement of the stage even if the substrate becomes larger.

An exposure method according to an embodiment of the present invention, for transferring an image of a pattern of a mask placed on a mask stage onto a substrate to be exposed, placed on a substrate stage, with projection through a projection optical system, comprises moving the mask stage and the substrate stage each in a predetermined scan direction, and controlling the position of at least one of the mask stage and the substrate stage with respect to the scan direction on the basis of a measured value of the laser interferometric measuring device, wherein the method further comprises a step of successively measuring, prior to the projection exposure, an Abbe error, along the scan direction, corresponding to a deviation of an exposure position of the projection optical system and a measurement point of the laser interferometric measuring device, a step of memorizing the measured Abbe error into a memory, a step of measuring a moving position of the mask stage and/or the substrate stage during the projection exposure of the mask pattern, through the laser interferometric measuring device, and a step of correcting the measured position of the mask stage or the substrate stage on the basis of the Abbe error memorized in the memory.

As described, an Abbe error with respect to the scan direction of each stage may be measured beforehand. During the projection exposure process, the moving position of each stage may be measured by the laser interferometric measuring device, and the thus measured position may be corrected on the basis of the Abbe error, having been measured and memorized beforehand. By doing so, it is possible to perform a high precision exposure procedure without a necessity of an using a measuring means for measurement of attitude precision even if the substrate stage becomes larger. Further, by correction based on Abbe error, it is possible to perform accurate position control even if the measurement point of the laser interferometric measuring device is deviated from the focal plane of the projection optical system. It is, therefore, possible to set the measurement point of the laser interferometric measuring device at a desired position.

Preferred embodiments of the present invention will now be described with reference to the drawings.

[First Embodiment]

Figure 1:
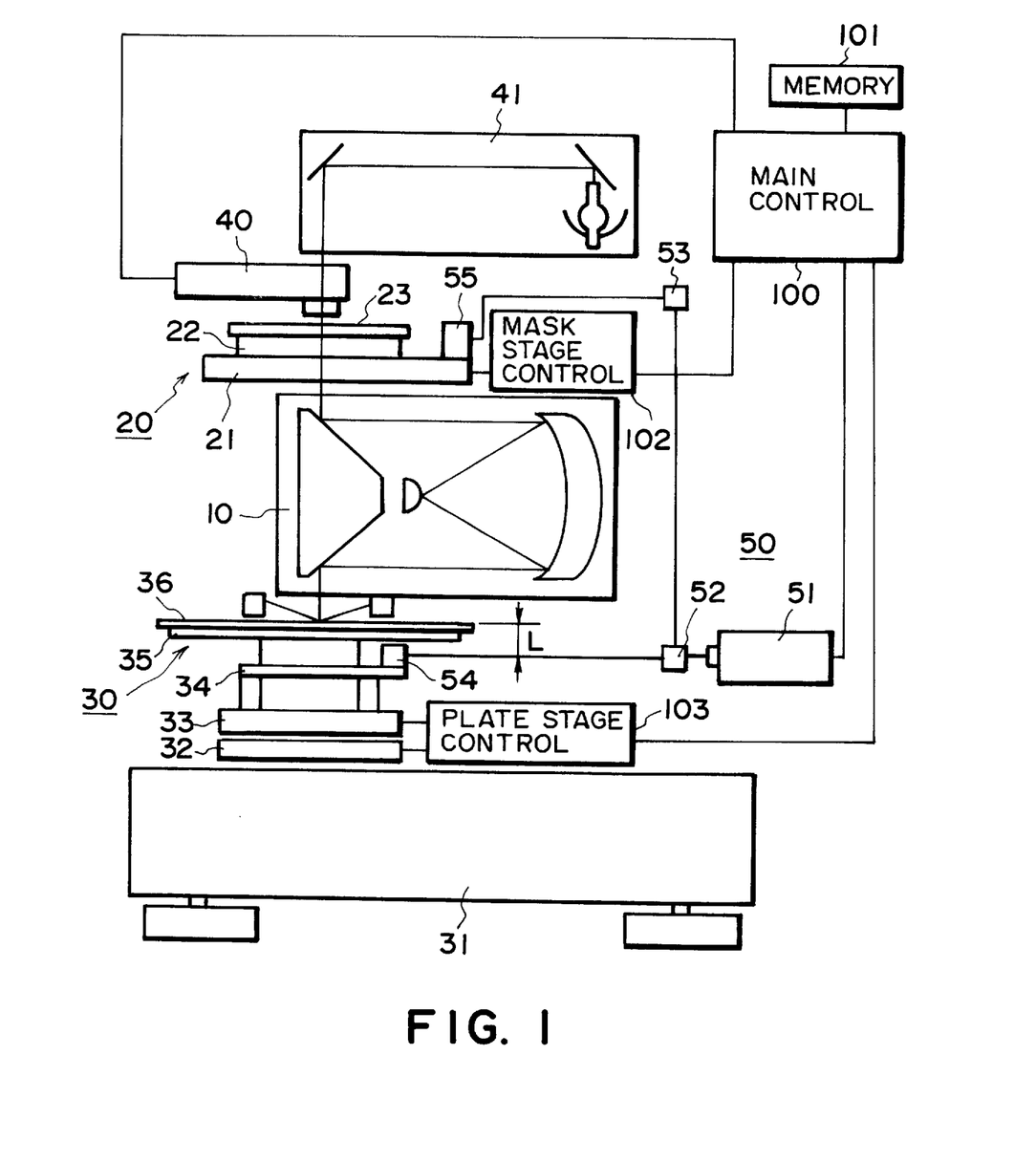
FIG. 1 is a schematic view of a general structure of an exposure apparatus according to a first embodiment of the present invention.
Figure 2:
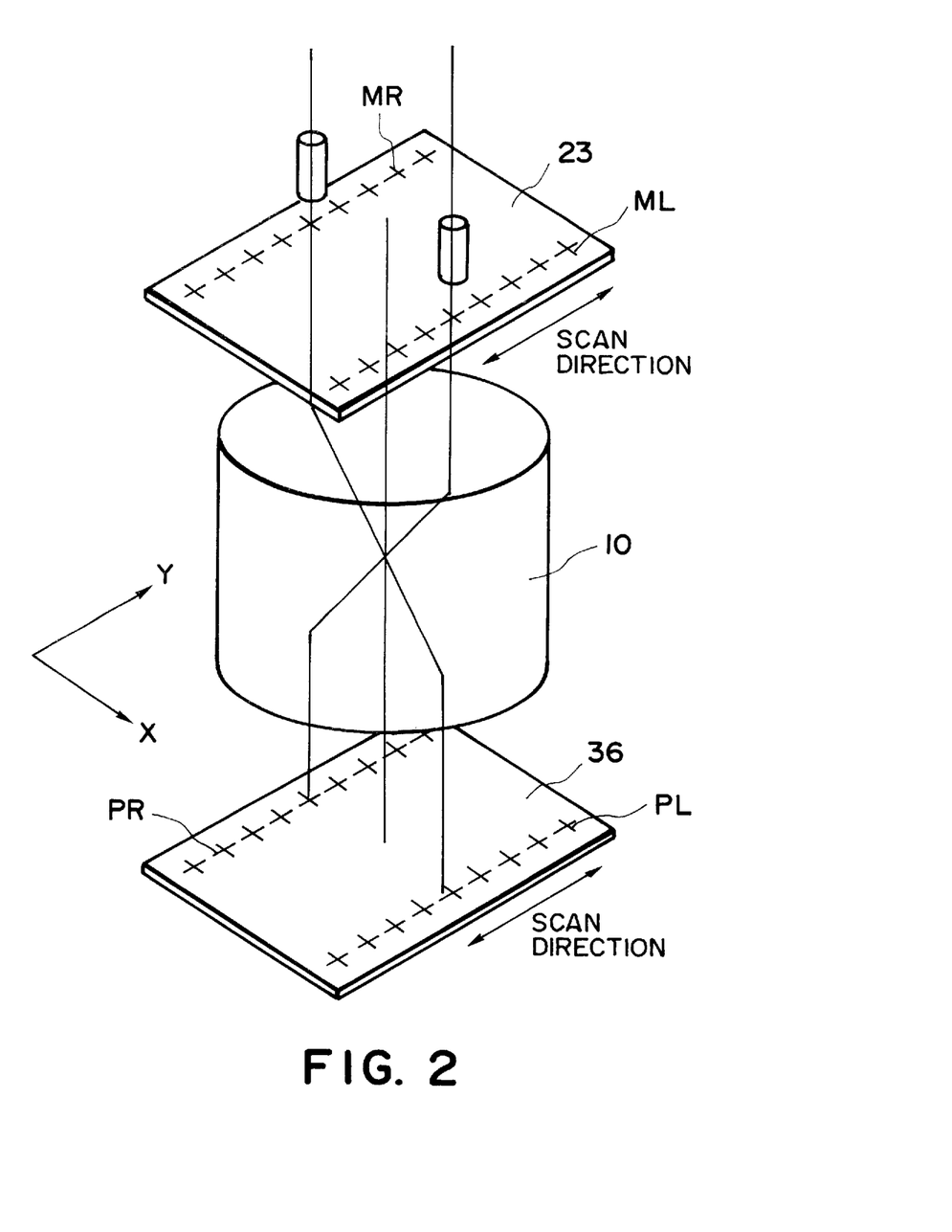
FIG. 2 is a schematic view for explaining a structure for projecting a plate mark onto a mask mark.
Figure 3:
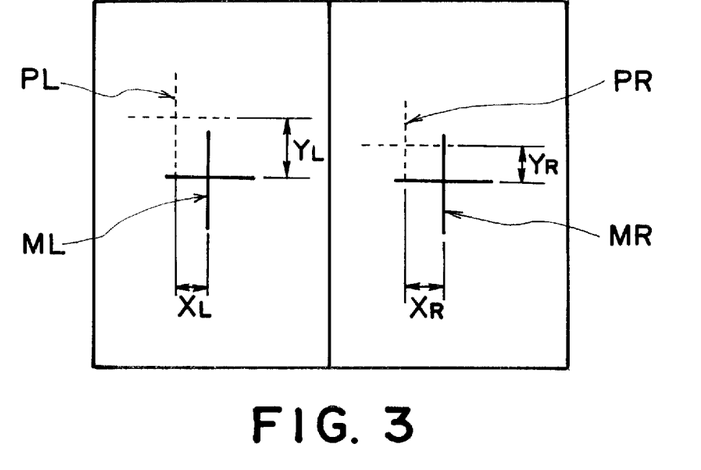
FIG. 3 is a schematic view for explaining an observation through an observation optical system, of a plate mark as projected onto a mask mark.

An Abbe error correcting system according to a first embodiment of the present invention will be described with reference to FIGS. 1–3. In this embodiment, an exposure apparatus, adapted for transfer of a pattern of a mask to a large-size substrate such as a glass substrate for a liquid crystal device, will be explained. FIG. 1 is a schematic view of a general structure of a scan type projection exposure apparatus according to an embodiment of the present invention, having a function of Abbe error correction. Disposed above a projection optical system 10 is a mask stage 20, and disposed below is a plate stage (substrate stage) 30. The mask stage 20 and the plate stage 30 are movable independently of each other, and moving positions of them can be measured and controlled by means of a laser interferometric measuring device 50.

The plate stage 30 comprises a Y stage 32 and an X stage 33 placed on a main base 31. The X and Y directions are orthogonal to each other. Mounted on the X-Y stage is a θ-Z stage 34 upon which a plate chuck 35 is placed. A plate 36 to be exposed is supported by the plate chuck. Thus, the plate 36 can be moved in the X, Y and Z directions, and it is supported for rotation along the X-Y plane. The θ-Z stage 34 serves, in the exposure process, to bring the surface of the plate 36 into coincidence with the plate-side focal plane of the projection optical system 10.

The mask stage 20 comprises a mask stage substrate 21 and an X-Y-θ stage placed thereon. A mask 23 having a pattern to be projected is placed on the X-Y-θ stage. Thus, the mask 23 can be moved in the X and Y directions, and it is also supported for rotation along the X-Y plane. Disposed above the mask stage 20 is an observation optical system 40 for observation of images of the mask 23 and the plate 36 through the projection optical system 10. Illumination optical system 41 is disposed above the observation optical system 40.

The positions of the mask stage 20 and the plate stage 30 are measured and controlled by means of the laser interferometric measuring device 50. The laser interferometric measuring device 50 includes a laser head 51, interference mirrors 52 and 53, a first reflection mirror 54 mounted on the θ-Z stage 34 and a second reflection mirror 55 mounted on the mask stage substrate 21. Here, the position of the laser beam of the laser interferometric measuring device 50, in relation to the mask stage 20, is approximately on the mask-side focal plane of the projection optical system 10 with respect to the vertical direction (optical axis direction of the projection optical system) and, in the horizontal direction, it is approximately at the optical axis position of the projection optical system 10. In relation to the plate stage 30, on the other hand, in the horizontal plane, it is approximately at the optical axis position of the projection optical system 10. However, with respect to the vertical direction, it is set to pass a point which is displaced, downwardly, by a distance L from the plate-side focal plane of the projection optical system 10.

Main control 100 serves to control the mask stage 20 to a desired position, through a mask stage control system 102 and on the basis of the position of the mask stage 20 as measured by the laser interferometric measuring device 50. Also, the main control 100 serves to control the plate stage 30 to a desired position, through a mask stage control system 103 and on the basis of the position of the plate stage 30 as measured by the laser interferometric measuring device 50.

Next, a method of measuring an Abbe error will be explained. FIG. 2 is a schematic view for explaining observation, by the observation optical system 40 and through the projection optical system 10, of the mask 23 having a pattern (reference) and of the plate 36 to be exposed. The mask 23 and the plate 36 are provided with cross-like mask marks MR and ML, and similar substrate marks PR and PL, for Abbe error measurement. They are disposed in two arrays in a lateral direction (X direction), each array including marks of a number n in the vertical direction (scan direction). The mask 23 and the plate 36 are placed on the mask stage 20 and the plate stage 30, respectively, and the marks formed on them are observed by the observation optical system 40 through the projection optical system 10. Abbe error measurement is done in this state. To this end, a pair (left and right) of mask marks and a pair of substrate marks are used, and one of the stages is moved in the X, Y and/or θ directions so that the mask marks MR and ML and the substrate marks PR and PL are registered with each other. Then, both of the mask stage 20 and the plate stage 30 are moved by the same amount in the scan direction (X direction), on the basis of measurement through the laser interferometric measuring device and under the control through the mask stage control system 102 and the plate stage control system 103, so that marks, different from those described above, such as marks juxtaposed in the scan direction for exposure, for example, can be observed. FIG. 3 shows what can be observed at this time. As shown in FIG. 3, mask marks MR and ML and substrate marks PR and PL can be observed at once, but they are not registered with each other. The amount of this misregistration corresponds to an Abbe error. If deviations in the X and Y directions of the marks within the right and left viewfields are denoted by $(X_R, Y_R)$ and $(X_L, Y_L)$, the Abbe error can be expressed by the following equations:

$$X = (X_R + X_L)/2$$

$$Y = (Y_R + Y_L)/2$$

wherein usually $X_R \cong X_L$ and $Y_R \cong Y_L$.

In this manner, while moving the mask stage 20 and the plate stage 30 in the scan direction as desired, the main control 100 successively measures an Abbe error in relation to each position of the stage, and the results are stored into a memory 101. During the exposure operation, after that, the main control 100 performs correction to the X-Y coordinates as measured by the laser interferometric measuring device 50, on the basis of the data memorized in the memory 101. Also, on the basis of the thus corrected X-Y coordinates, it controls the mask stage 20 through the mask stage control system and controls the plate stage 30 through the plate stage control system. The above-described procedure enables high precision positioning with Abbe error removed. Here, it is to be noted that, in this embodiment, the laser beam for detection of the mask stage 20 position is substantially coincident with the mask-side focal plane, with respect to the optical axis direction. As a result, in relation to the mask stage 20, there does not occur an Abbe error such as one related to the plate stage 30 and attributable to a variation in attitude during movement. Thus, what is measured is the Abbe error of the plate stage.

[Second Embodiment]

Figure 4A:
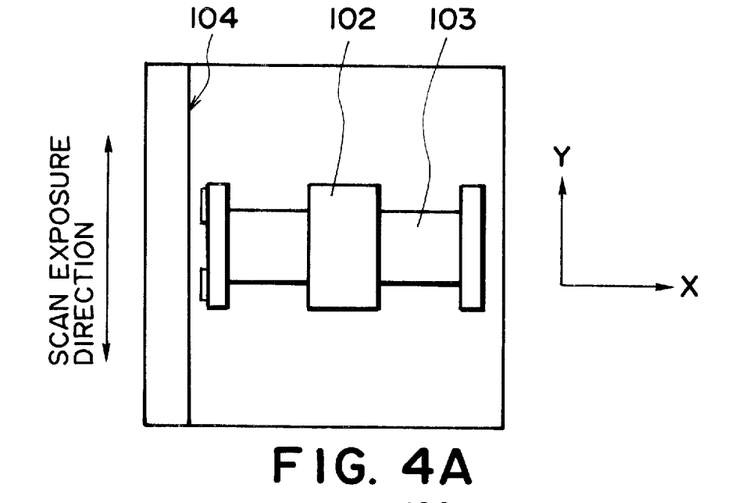
FIGS. 4A and 4B are schematic views, respectively, of plate stage structures according to second and third embodiments of the present invention, respectively.
Figure 4B:
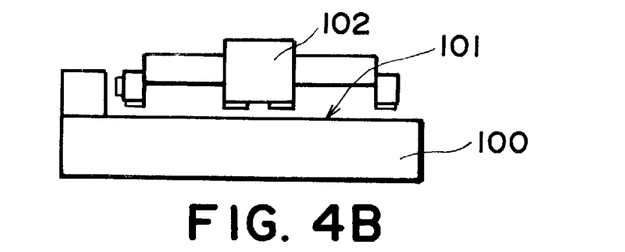

FIGS. 4A and 4B are schematic views of a plate stage 30 of a static pressure bearing structure. In this stage mechanism, the whole surface of a stage base 100 provides an X-Y guiding surface 101. Disposed on this guiding surface 101 are an X-Y stage 102 and a Y stage 103. The Y stage 103 is movable in the Y direction, along the guiding surface 101 with respect to the vertical direction and along a yaw guiding surface 104 with respect to the X direction. The X-Y stage 102 is movable in the Y direction together with the Y stage 103, and it is also movable in the X direction along the Y stage 103.

Figure 5:
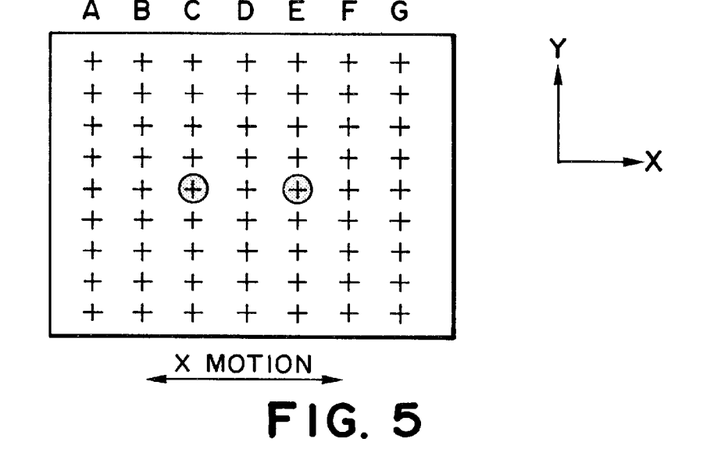
FIG. 5 is a schematic view for explaining a plate having a measurement pattern to be used in the second and third embodiments of the present invention.

In this stage mechanism, when a substrate is to be moved in the X-axis direction to perform a scan exposure in the Y direction, and if the positional relationship with respect to the Y-axis guiding means differs, the attitude precision (pitching and rolling) of the X-Y stage 102 during the exposure process differs. Thus, in order to perform the Abbe error correction of the present invention, the Abbe error has to be measured in accordance with the method described with reference to the first embodiment, in relation to all the scan axes. In the first embodiment, an Abbe error measurement plate having the same pattern as the error measurement pattern of the mask is used. In this embodiment, since the Abbe error measurement has to be done with respect to all the scan axes, a plate such as shown in FIG. 5 is used to perform the Abbe error measurement. More specifically, the plate of FIG. 5 is provided with a number of measurement marks arrayed two-dimensionally in the X and Y directions. The method of measurement in this case will be explained briefly.

The Abbe error measurement plate of FIG. 5 has equidistantly disposed measurement patterns which are formed in seven arrays A, B, C, D, E, F and G. The interval d between the arrays is equal to a half of the interval of the two arrays of the measurement patterns formed on the mask 23 of FIG. 2. In place of the plate of FIG. 2, the plate of FIG. 5 is put on the plate chuck of the plate stage 30.

First, when the X and Y coordinates of the plate stage 30 are at the center, the patterns of arrays C and E are used to perform the Abbe error measurement. Then, the X axis of the plate stage 30 is shifted by +d mm, and, by using the patterns of arrays B and D, the Abbe error measurement is performed again. Similarly, if the stage is moved by +2d mm, patterns of arrays A and C are used. If, to the contrary, the stage is moved by −d mm, patterns of arrays D and F are used. If the stage is moved by −2d mm, patterns of arrays E and G are used.

In this manner, at a total of forty-five (45) locations (five locations in the X direction and nine locations in the Y direction), the Abbe error is measured successively, and the results are memorized. Then, the exposure process is performed while successively correcting the X-Y deviation of the coordinates as measured by the laser interferometric measuring device, on the basis of the stored data. As a result, high positioning precision can be retained.

[Third Embodiment]

In the second embodiment, patterns of seven arrays are formed on the plate. However, the number of arrays is not limited to seven. In accordance with the situation for the manufacture of actual devices, pattern disposition may be set as desired.

[Fourth Embodiment]

In the second and third embodiments, a large size plate having a number of patterns is prepared for the Abbe error measurement. Practically, such a plate may be expensive. A more convenient example with substantially the same advantageous results, will now be explained.

A mask and a plate similar to those of the first embodiment are used. This mask and plate are set in a state as shown in FIG. 2. Here, it is assumed that the X-axis position of the plate stage 30 at that moment is at the center. In such a state, Abbe error measurement is performed in a similar manner as in the first embodiment. Subsequently, the plate stage 30 is shifted by a predetermined amount in the X direction. In that state, it is not possible to observe a relative positional deviation of the plate relative to the mask. So, in order to enable it, while keeping the plate stage as it is, only the plate is mounted with a shift below the optical axis. By doing it, measurement of Abbe error is enabled with the use of the same plate, even if the scan exposure position (Y axis) of the plate stage 30 varies. By repeating this procedure, it is possible to accomplish Abbe error measurement with respect to all of the scan exposure axes.

[Fifth Embodiment]

In the first embodiment, the position of the mask position measuring laser beam with respect to the vertical direction is approximately aligned with the mask-side focal plane. Even when it is spaced by a certain distance, if the measurement is performed in the same measurement manner, the result is that the Abbe error of the mask stage and the plate stage is added. On that occasion, since the added error can be corrected in relation to the plate stage side, no inconvenience results.

[Sixth Embodiment]

In the embodiments described above, patterns of a mask and a plate are observed by an observation optical system and through a projection optical system, and an Abbe error is measured. In such a case, there is a possibility that a measurement error attributable to the observation optical system is added. In consideration of this, a resist material may be applied to the plate and an actual exposure process may be performed to it. After a development process, patterns as developed may be observed to measure a deviation in the X and Y directions. Similar advantageous results are obtainable with this procedure.

[Seventh Embodiment]

In the embodiments described above, the mask stage and the plate stage 30 are moved simultaneously in the scan exposure direction, and Abbe error is measured. However, the mask stage may be held fixed and only the plate stage 30 may be moved, and measurement of a deviation of patterns of the plate relative to the patterns of the mask may be performed. By measuring Abbe error of the plate stage 30 at each of the different stage positions, substantially the same advantageous results are attainable.

[Eighth Embodiment]

In the embodiments described above, Abbe error of the plate stage is measured through the projection optical system and by using patterns of the mask as a reference. However, a separate optical system (called an "off-axis optical system") for observation without the projection optical system may be used, and an optical system different for the mask and a certain reference different from the mask may be used. By measuring Abbe error of the plate stage 30 with respect to such a reference, substantially the same advantageous results are attainable.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for transferring a pattern of a mask onto a substrate to be exposed, with projection through a projection optical system, said apparatus comprising:

a stage being movable while carrying the substrate thereon;

a laser interferometer for measuring a position of said stage, wherein a measurement position of a laser beam of said laser interferometer deviates relative to a focal plane of the projection optical system, with respect to a direction of an optical axis of the projection optical system;

a memory for memorizing, with respect to each of different positions of said stage, information related to an Abbe error produced in accordance with the deviation of the focal plane and the measurement position of said laser interferometer; and a controller for controlling said stage on the basis of a corrected value corresponding to a measured value of said laser interferometer as corrected by the Abbe error.

2. An apparatus according to claim 1, further comprising an optical system for detecting a position of a mark of the substrate placed on said stage, wherein said controller determines the Abbe error by moving said stage through a predetermined amount on the basis of a measured value of said laser interferometer and then by detecting the position of the mark through the optical system.

3. A scanning exposure apparatus for transferring a pattern of a mask onto a substrate to be exposed, with projection through a projection optical system, said apparatus comprising:

a substrate stage being movable while carrying the substrate thereon;

a mask stage being movable while carrying the mask thereon;

laser interferometric measuring means for measuring a position of said substrate stage and a position of said mask stage;

a memory for memorizing, with respect to each of different positions of said substrate stage and of said mask stage, information related to an Abbe error produced in accordance with a deviation of an exposure position of said projection optical system and a measurement point, for said substrate stage, of said laser interferometric measuring means; and control means for controlling at least one of said substrate stage and said mask stage on the basis of a corrected value, corresponding to a measured value of said laser interferometric measuring means as corrected by the Abbe error, and for scanning said substrate stage and said mask stage relative to the projection optical system.

4. An apparatus according to claim 3, further comprising an optical system for detecting a relative position of a mark of a mask placed on said mask stage and a mark of a substrate placed on said substrate stage, wherein said control means determines the Abbe error by relatively moving said substrate stage and said mask stage through a predetermined amount on the basis of a measured value of said laser interferometric measuring means and then by detecting the positional deviation through the optical system.

5. An apparatus according to claim 3, wherein a position of a laser beam of said laser interferometric measuring means deviates relative to a focal plane of the projection optical system with respect to a direction of an optical axis of the projection optical system.

6. An exposure method for transferring a pattern of a mask onto a substrate to be exposed, with projection through a projection optical system, said method comprising the steps of:

moving the substrate by a substrate stage;

measuring a position of the stage through a laser interferometer, wherein a measurement position of a laser beam of the laser interferometer deviates relative to a focal plane of the projection optical system, with respect to a direction of an optical axis of the projection optical system;

memorizing, with respect to each of different positions of the stage, information related to an Abbe error produced in accordance the deviation of the focal plane and the measurement position of the laser interferometer; and controlling the stage on the basis of a corrected value corresponding to a measured value of the laser interferometer as corrected by the Abbe error.

7. A method according to claim 6, wherein, in said controlling step, the Abbe error is determined by moving the stage through a predetermined amount on the basis of a measured value of the laser interferometric measuring device and then by detecting the position of a mark of the stage.

8. A scanning exposure method for transferring a pattern of a mask onto a substrate to be exposed, with projection through a projection optical system, said method comprising the steps of:

moving the substrate by a substrate stage;

moving the mask by a mask stage;

measuring a position of the substrate stage and a position of the mask stage through a laser interferometric measuring device;

memorizing, with respect to each of different positions of the substrate stage and of the mask stage, information related to an Abbe error produced in accordance with a deviation of an exposure position of the projection optical system and a measurement point, for the substrate stage, of the laser interferometric measuring device; and controlling at least one of the substrate stage and the mask stage on the basis of a corrected value, corresponding to a measured value of the laser interferometric measuring device as corrected by the Abbe error, and scanning the substrate stage and the mask stage relative to the projection optical system.

9. A method according to claim 8, further comprising relatively moving the substrate stage and the mask stage through a predetermined amount on the basis of a measured value of the laser interferometric measuring device, and detecting a relative positional deviation between a mark of the mask placed on the mask stage and a mark of the substrate placed on the substrate stage, to determine the Abbe error.

10. A method according to claim 8, wherein a position of a laser beam of the laser interferometric measuring device deviates relative to a focal plane of the projection optical system with respect to a direction of an optical axis of the projection optical system.

* * * * *

UNITED STATES PATENT AND TRADEMARK OFFICE
CERTIFICATE OF CORRECTION

PATENT NO. : 5,850,291
DATED : December 15, 1998
INVENTOR(S) : SHINJI TSUTSUI

It is certified that error appears in the above-identified patent and that said Letters Patent is hereby corrected as shown below:

COLUMN 5:

line 39, "an" should be deleted and "of" (second occurrence) should read --of an--.

COLUMN 9:

line 2, "above," should read --above, the--.

COLUMN 10:

line 49, "accordance" should read --accordance with--.

Signed and Sealed this

Seventeenth Day of August, 1999

Attest:

Q. TODD DICKINSON

*Attesting Officer*      *Acting Commissioner of Patents and Trademarks*